United States Patent
Lin et al.

(10) Patent No.: US 7,390,753 B2
(45) Date of Patent: Jun. 24, 2008

(54) IN-SITU PLASMA TREATMENT OF ADVANCED RESISTS IN FINE PATTERN DEFINITION

(75) Inventors: Li-Te Lin, Hsin-chu County (TW); Yui Wang, Shalu Township, Taichung County (TW); Huan-Just Lin, Hsin-chu County (TW); Yuan-Hung Chiu, Taipei (TW); Hun-Jan Tao, Hsinchu (TW)

(73) Assignee: Taiwan Semiconductor Mfg. Co., Ltd., Hsin-Chu (TW)

( * ) Notice: Subject to any disclaimer, the term of this patent is extended or adjusted under 35 U.S.C. 154(b) by 10 days.

(21) Appl. No.: 11/274,109

(22) Filed: Nov. 14, 2005

(65) Prior Publication Data

US 2007/0111110 A1    May 17, 2007

(51) Int. Cl.
*H01L 21/302* (2006.01)
(52) U.S. Cl. .................. 438/725; 438/705; 438/714; 438/717; 430/5; 216/47; 216/62; 216/67
(58) Field of Classification Search .............. 216/47, 216/49, 62, 67; 430/5; 438/705, 714, 717 438/725, 950, 952
See application file for complete search history.

(56) References Cited

U.S. PATENT DOCUMENTS

| | | | | |
|---|---|---|---|---|
| 6,103,457 A | * | 8/2000 | Gabriel | 430/318 |
| 6,136,723 A | * | 10/2000 | Nagase | 438/725 |
| 6,811,956 B1 | * | 11/2004 | Gabriel | 430/313 |
| 6,923,920 B2 | * | 8/2005 | Taylor et al. | 216/49 |
| 2002/0039704 A1 | * | 4/2002 | Din et al. | 430/313 |
| 2005/0048787 A1 | * | 3/2005 | Negishi et al. | 438/706 |

FOREIGN PATENT DOCUMENTS

| JP | 07-094467 | * | 4/1995 |
|---|---|---|---|
| JP | 2000-221698 | * | 8/2000 |

* cited by examiner

*Primary Examiner*—George A. Goudreau
(74) *Attorney, Agent, or Firm*—Tung & Associates

(57) ABSTRACT

A novel, in-situ plasma treatment method for eliminating or reducing striations caused by standing waves in a photoresist mask, is disclosed. The method includes providing a photoresist mask on a BARC (bottom anti-reflective coating) layer that is deposited on a feature layer to be etched, etching the BARC layer and the underlying feature layer according to the pattern defined by the photoresist mask, and subjecting the photoresist mask to a typically argon or hydrogen bromide plasma before, after, or both before and after etching of the BARC layer prior to etching of the feature layer. Preferably, the photoresist mask is subjected to the plasma both before and after etching of the BARC layer.

20 Claims, 2 Drawing Sheets

IN-SITU PLASMA TREATMENT OF ADVANCED RESISTS IN FINE PATTERN DEFINITION

FIELD OF THE INVENTION

The present invention relates to photolithography processes used in the formation of integrated circuit (IC) patterns on photoresist in the fabrication off semiconductor integrated circuits. More particularly, the present invention relates to an in-situ argon or hydrogen bromide plasma treatment method for strengthening an advanced photoresist for fine patterning and improving resist selectivity and eliminating or reducing resist tilting and resist striations during plasma etching.

BACKGROUND OF THE INVENTION

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

In a common IC fabrication technique known as a dual damascene technique, lower and upper dielectric layers are sequentially deposited on a substrate. A via opening is patterned and etched in the lower dielectric layer, and a trench opening is patterned and etched in the upper dielectric layer. At each step, a patterned photoresist layer is used to etch the trench and via openings in the corresponding dielectric layer. A conductive copper line is then formed in the trench and via openings, typically using electrochemical plating (ECP) techniques, to form the horizontal and vertical IC circuit interconnects on the substrate.

Photoresist materials are coated onto the surface of a wafer, or onto a dielectric or conductive layer on a wafer, by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

During the photolithography step of semiconductor production, light energy is applied through a reticle or mask onto the photoresist material previously deposited on the wafer to define circuit patterns which will be etched in a subsequent processing step to define the circuits on the wafer. A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer.

Spin coating of photoresist on wafers, as well as the other steps in the photolithography process, is carried out in an automated coater/developer track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

A typical method of forming a circuit pattern on a wafer includes introducing the wafer into the automated track system and then spin-coating a photoresist layer onto the wafer. The photoresist is next cured by conducting a soft bake process. After it is cooled, the wafer is placed in an exposure apparatus, such as a stepper, which aligns the wafer with an array of die patterns etched on the typically chrome-coated quartz reticle. When properly aligned and focused, the stepper exposes a small area of the wafer, then shifts or "steps" to the next field and repeats the process until the entire wafer surface has been exposed to the die patterns on the reticle. The photoresist is exposed to light through the reticle in the circuit image pattern. Exposure of the photoresist to this image pattern cross-links and hardens the resist in the circuit pattern. After the aligning and exposing step, the wafer is exposed to post-exposure baking and then is developed and hard-baked to develop the photoresist pattern.

The circuit pattern defined by the developed and hardened photoresist is next transferred to an underlying metal layer using an etching process, in which metal in the metal layer not covered by the cross-linked photoresist is etched away from the wafer with the metal under the cross-linked photoresist that defines the device feature protected from the etchant. Alternatively, the etched material may be a dielectric layer in which via openings and trench openings are etched according to the circuit pattern, such as in a dual damascene technique. The via and trench openings are then filled with a conductive metal such as copper to define the metal circuit lines. As a result, a well-defined pattern of metallic microelectronic circuits, which closely approximates the cross-linked photoresist circuit pattern, is formed on the wafer.

FIG. 1A illustrates a semiconductor wafer portion 10 on which a semiconductor IC device feature is being fabricated. The portion 10 includes a substrate 12, a feature layer 14 deposited on the substrate 12, a BARC (bottom anti-reflective coating) layer 18 deposited on the feature layer 14, and a photoresist mask 16 patterned and developed on the BARC layer 18. The photoresist mask 16 may include an organic spin-on photoresist compound that is selectively exposed to deep-UV (DUV) radiation at the patterning and developing photolithography steps. Multiple mask openings 17 extend through the photoresist mask 16 for exposure of the underlying feature layer 14 to an etching process. During the alignment and exposure step, the BARC layer 18 minimizes reflection of monochromatic light from the underlying feature layer 14 to areas of the photoresist mask 16 which are shielded by a mask or reticle, and thus, are not to be exposed to light. The feature layer 14 may be a polysilicon layer which is patterned to form a gate using conventional fabrication techniques, for example. Alternatively, the feature layer 14 may be a metal conductive layer or a dielectric layer which will be etched and subsequently filled with metal to form a metal conducting line.

As shown in FIG. 1B, the BARC layer 18 is initally etched according to the pattern of the photoresist mask 16. Next, as shown in FIG. 1C, the underlying feature layer 14 is etched, according to the pattern of the photoresist mask 16, to form feature openings 15 that correspond in size and position to the mask openings 17. Accordingly, areas of the feature layer 14 exposed to the etchant through the mask openings 17 are etched, whereas areas of the feature layer 14 which are covered by the photoresist mask 16 are protected from the etchant and remain intact. During the etch process, the photoresist mask 16 is progressively etched and gradually decreases in thickness. Finally, as shown in FIG. 1D, the photoresist mask 16 is stripped from the underlying BARC layer 18. The BARC layer 18 may also be removed from the feature layer 14.

At the photolithography alignment and exposure step, in which the photoresist mask 16 is exposed to monochromatic light through a mask or reticle (not shown) to transfer the desired feature pattern to the photoresist mask 16, some of the light is reflected from the feature layer 14 to areas of the photoresist mask 16 which are covered by the mask or reticle. This causes light wave reflection and interference in the photoresist mask 16, resulting a phenomenon known as standing waves in the cross-sectional profile of the photoresist mask 16.

While the BARC layer 18 minimizes the effect of standing waves in the photoresist mask 16, the occurrence of standing waves remains particularly problematic in deep-UV (DUV) resists because many materials are more reflective at the shorter DUV wavelengths. As a result of the weak etching resistance of 193 nm and 157 nm photoresists, after the exposure and development step the sidewalls of the mask openings 17 exhibit striations of overexposed and underexposed areas. During the etch process, the presence of striations in the photoresist mask 16 frequently causes the profile of the remaining photoresist mask 16 to become tilted or otherwise distorted. This compromises resist selectivity, substantially degrades the resolution of the image in the photoresist mask 16 and, in turn, distorts the feature pattern image etched in the underlying feature layer 14, as shown in FIG. 1D. Accordingly, a novel method is needed to reduce the striation or tilting effect in the sidewalls of mask openings in a resist mask in order to improve resist selectivity, prevent or minimize tilting or bending of the resist profile and enhance the resolution of an image etched in a feature layer.

Accordingly, an object of the present invention is to provide a novel method for reducing the effects of standing waves in a resist mask.

Another object of the present invention is to provide a novel method which reduces striations in sidewalls of mask openings in a resist mask to enhance resist selectivity.

Still another object of the present invention is to provide a novel method which enhances the integrity and structural strength of a resist mask.

Yet another object of the present invention is to provide a novel method which maintains or improves CD uniformity in a resist mask.

A still further object of the present invention is to provide a novel in-situ plasma treatment method which enhances the resolution of a circuit pattern image transferred from a resist mask to a feature layer on a substrate.

Yet another object of the present invention is to provide a novel in-situ plasma treatment method which includes subjecting a photoresist mask to a photoresist-strengthening plasma before or during an etching process.

SUMMARY OF THE INVENTION

In accordance with these and other objects and advantages, the present invention is generally directed to a novel, in-situ plasma treatment method for eliminating or reducing striations caused by standing waves in a photoresist mask. The method includes providing a photoresist mask on a BARC (bottom anti-reflective coating) layer that is deposited on a feature layer to be etched, etching the BARC layer and the underlying feature layer according to the pattern defined by the photoresist mask, and subjecting the photoresist mask to a typically argon or hydrogen bromide photoresist-strengthening plasma before, after, or both before and after etching of the BARC layer prior to etching of the feature layer. Preferably, the photoresist mask is subjected to the plasma both before and after etching of the BARC layer.

BRIEF DESCRIPTION OF THE DRAWINGS

The invention will now be described, by way of example, with reference to the accompanying drawings, in which.

DETAILED DESCRIPTION OF THE INVENTION

The present invention includes a novel, in-situ plasma treatment method which is suitable for the elimination or reduction of striations in mask opening sidewalls caused by standing waves in a photoresist mask. According to the method, a photoresist mask is provided on a BARC (bottom anti-reflective coating) layer that is deposited on a feature layer which is to be etched for the subsequent fabrication of gate oxide structures or circuit pattern metal lines, for example. The BARC layer and the underlying feature layer are sequentially etched, typically in separate etch steps, according to the pattern defined by the photoresist mask. The photoresist mask is exposed to a typically argon or hydrogen bromide photoresist-strengthening plasma before, after, or both before and after etching of the BARC layer. Preferably, the photoresist mask is subjected to the photoresist-strengthening plasma both before and after etching of the BARC layer.

The plasma-exposure step or steps of the present invention may be carried out in a conventional plasma etcher. Typical process conditions for an argon plasma exposure process include a chamber pressure of typically about 5~80 mTorr; a source power of typically about 300~1,200 W; an argon gas flow rate of typically about 50~480 sccm; and a plasma exposure time of typically about 15~60 sec.

Typical process conditions for a hydrogen bromide plasma exposure process include a chamber pressure of typically about 5~80 mTorr; a source power of typically about 300~1, 200 W; a hydrogen bromide flow rate of typically about 50~480 sccm; and a plasma exposure time of typically about 15~60 sec. Other plasmas not limited to argon and hydrogen bromide can be used to carry out the invention under similar process conditions.

Figure 1A:
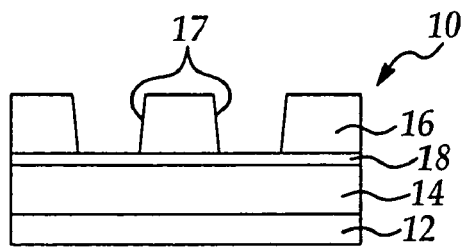
FIGS. 1A-1D are cross-sectional views of a portion of a semiconductor portion, illustrating a conventional process for etching openings in a feature layer.
Figure 1B:
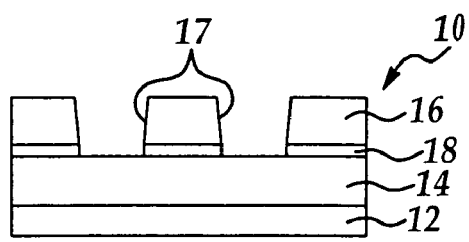
Figure 1C:
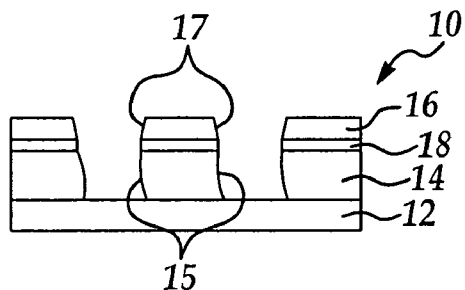
Figure 1D:
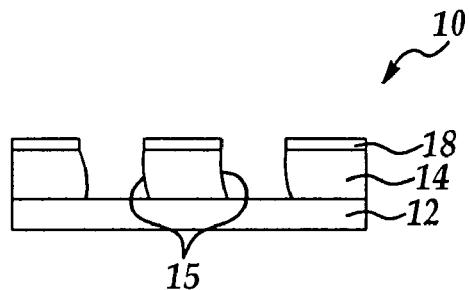
Figure 2:
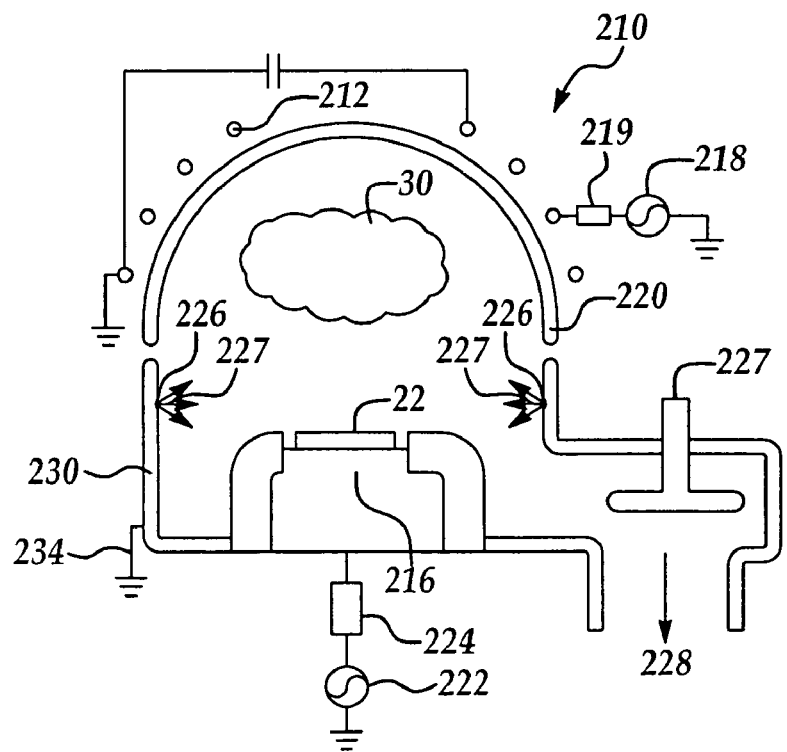
FIG. 2 is a schematic of an etch chamber in implementation of the present invention.

Referring to FIG. 2, schematic of an illustrative etch chamber 210 suitable for implementation of the present invention is shown. The etch chamber 210 typically includes a chamber wall 230, which is connected to an electrical ground 234, and an upper portion 220. An inductive coil antenna 212 is positioned adjacent to the upper portion 220. A source radio frequency (RF) generator 218 is connected to the inductive coil antenna 212, typically through an impedance matching network 219.

A support pedestal 216 is provided in the etch chamber 210 for supporting a substrate 22 thereon. A bias RF frequency power generator 222 is connected to the support pedestal 216, typically through an impedance matching network 224. Process gases 227 are introduced into the etch chamber 210 through an entry port or ports 226. A vacuum pump (not shown) and a throttle valve 227 are connected to the etch chamber 210 to evacuate gaseous species 228 from the etch chamber 210.

Referring next to FIGS. 3A-3D, in conjunction with FIG. 2, the in-situ plasma treatment method of the present invention is carried out on a semiconductor portion 20 which is shown in cross-section in FIGS. 3A-3D. An integrated circuit device feature or features, such as one or multiple conductive interconnect metal lines (not shown) or a polysilicon gate (not shown), is to be fabricated on the semiconductor portion 20 throughout a semiconductor fabrication process. A portion of this fabrication process sequence will be hereinafter detailed in FIGS. 3A-3D.

Figure 3A:
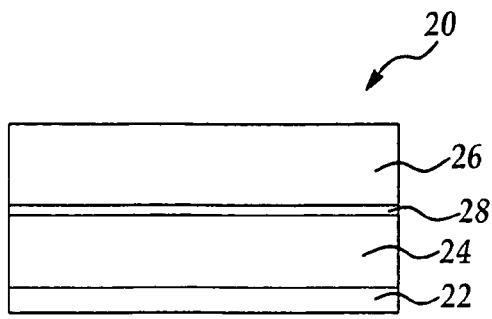
FIGS. 3A-3D are cross-sectional views of a semiconductor portion, illustrating implementation of the in-situ plasma treatment method of the present invention and etching of feature openings in a feature layer provided on the substrate.

FIG. 3A illustrates the initial layered structure of the semiconductor portion 20 prior to implementation of the device feature fabrication techniques. The semiconductor portion 20 includes a typically silicon semiconductor wafer substrate 22. A feature layer 24 is deposited on the substrate 22. The feature layer 24 may be a single layer of material or multiple layers of material which are sequentially deposited on the substrate 22 and each other to form a layer stack.

In the case of a damascene process, in which metal interconnect lines are fabricated on the substrate 22, the feature layer 24 is a dielectric layer. In cases in which one or more gates of MOS transistors are to be fabricated on the substrate 22, the feature layer 24 typically includes a thin layer of silicon dioxide that can be grown on the substrate 22 using conventional thermal oxidation techniques. An overlying layer of polysilicon is deposited over the layer of silicon dioxide using conventional chemical vapor deposition (CVD) and/or plasma enhanced chemical vapor deposition (PECVD) techniques.

A BARC (bottom anti-reflective coating) layer 28 is typically deposited on the feature layer 24. A photoresist layer 26 is blanket-deposited on the BARC layer 28. The BARC layer 28 may be an organic or inorganic material which suppresses unintended reflection of light from the feature layer 24 to the photoresist layer 26 during the subsequent alignment and exposure step of photolithography. The BARC layer 28 and photoresist layer 26 may be formed using conventional deposition equipment and techniques known by those skilled in the art.

The photoresist layer 26 is typically a deep-ultraviolet (DUV) resist. Deep-UV photoresists are patterned using deep ultraviolet radiation having wavelengths of between about 100 nm and about 300 nm. Typically, the photoresist layer 26 is a PMMA (polymethylmethacrylate)-based photoresist which is patterned using deep-UV radiation having a wavelength of less than typically about 200 nm, and preferably, less than typically about 193 nm. The photoresist layer 26 includes organic-based polymer resin molecules which adhere to the underlying feature layer 24 to prevent etching of the non-exposed portions of the feature layer 24 in subsequent etching steps.

The thickness of the photoresist layer 26 may vary depending on the type of etching process to be performed on the feature layer 24. An important factor in the consideration of photoresist layer thickness is the quantity of material which will be etched away from the photoresist layer 26 during the etching process. The photoresist layer 26 must have a thickness which is sufficient to precisely control the etching process. Depending on the particular application, the thickness of the photoresist layer 26 is typically about 1,000~5,000 angstroms.

Figure 3B:
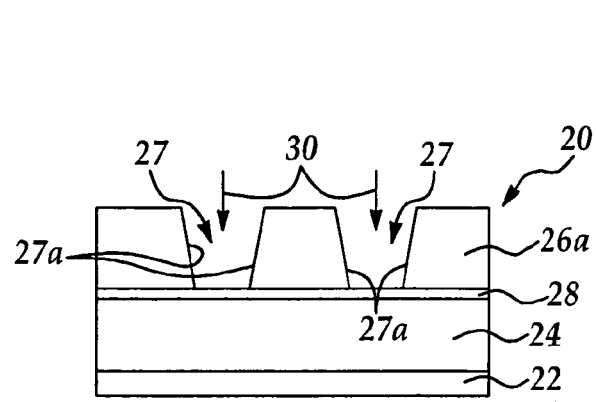

As shown in FIG. 3B, a photoresist mask 26a is formed in the photoresist layer 26 by exposure of the photoresist layer 26 to deep-UV radiation through a mask or reticle (not shown) in an alignment and exposure step, followed by development of the exposed photoresist layer 26. The deep-UV radiation applied to the photoresist layer 26 preferably has a wavelength of less than typically about 200 nm, and preferably, less than typically about 193 nm. The developed photoresist mask 26a includes multiple mask openings 27 which correspond to the circuit pattern transferred from the mask or reticle to the photoresist layer 26.

During the alignment and exposure step, the BARC layer 28 minimizes reflection of monochromatic light from the underlying feature layer 24 to areas of the photoresist layer 26 which are shielded by the mask or reticle, and thus, are not to be exposed to light. However, due to the typically high reflectivity of the feature layer 24 at the short DUV wavelengths, some of the deep-UV radiation is nevertheless reflected from the feature layer 24 to shielded areas of the photoresist layer 26. Consequently, standing waves form in the photoresist mask 26a and are manifested by striations 27a of overexposed and underexposed areas in the sidewalls of the mask openings 27, as shown in FIG. 3B.

Figure 3C:
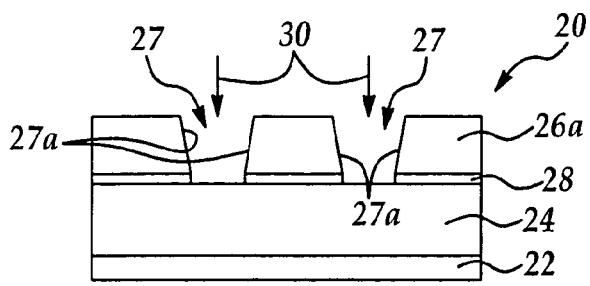

Normally, these striations 27a tend to distort the image of the circuit pattern feature which is etched in the underlying feature layer 24 in the subsequent etching process. According to the method of the present invention, however, the striations 27a are largely eliminated from the photoresist mask 26a by subjecting the photoresist mask 26a to one or multiple plasma-exposure steps. A plasma-exposure step may be carried out prior to etching of the BARC layer 28, as shown in FIG. 3B; after etching of the BARC layer 28, as shown in FIG. 3C; and preferably, both before and after etching of the BARC layer 28, as shown in FIGS. 3B and 3C, respectively, and hereinafter further described.

As shown in FIGS. 2 and 3B, the photoresist mask 26a is subjected to a photoresist-strengthening plasma 30 by initially placing the substrate 22 of the semiconductor portion 20 on the support pedestal 216 in the etch chamber 210, as shown in FIG. 2, typically prior to etching of the BARC layer 28, as shown in FIG. 3B. A plasma-generating gas 227 is introduced into the etch chamber 210 through the entry port or ports 226. In one embodiment, the plasma-generating gas 227 is argon. In another embodiment, the plasma-generating gas 227 is hydrogen bromide. In the etch chamber 210, the source RF generator 218 strikes a plasma 30 which contacts the photoresist mask 26a, including the striations 27a in the sidewalls of the mask openings 27, as shown in FIG. 3B. The plasma 30 partially etches the striations 27a and smooths the sidewalls of the mask openings 27.

Typical process conditions for an argon plasma-exposure step are as follows: a chamber pressure of typically about 5~80 mTorr; a source RF power of typically about 300~1,200 W; an argon gas flow rate of typically about 50~480 sccm; and a plasma exposure time of typically about 15~60 sec. During the plasma-exposure step, the bias RF frequency power generator 22 typically applies a bias power of <50 W to the substrate 22 through the substrate support 216.

Typical process conditions for a hydrogen bromide-exposure step are as follows: a chamber pressure of typically about 5~80 mTorr; a source RF power of typically about 300~1,200 W; a hydrogen bromide flow rate of typically about 50~480 sccm; and a plasma exposure time of typically about 15~60 sec. During the plasma-exposure step, the bias RF frequency power generator 222 typically applies a bias power of <50 W to the substrate 22 through the substrate support 216.

After exposure of the photoresist mask 26a to the plasma 30 in the first plasma-exposure step of FIG. 3B, the BARC layer 29 is etched in the etch chamber 210, according to the pattern of the photoresist mask 26a. Accordingly, the plasma 30 is evacuated from the etch chamber 210 as gaseous species 228. Etchant gases are introduced into the etch chamber 210 through the entry port or ports 226, and an etchant plasma is generated in the etch chamber 210 to etch the BARC layer 28. Etching of the BARC layer 28 may be carried out using conventional etching process conditions known by those skilled in the art.

During etching of the BARC layer 28, some of the photoresist mask 26a is etched as well, and the thickness of the photoresist mask 26a is therefore reduced. After etching of the BARC layer 28 is completed, the residual etchant gases are evacuated from the etch chamber 210. As shown in FIG. 3C, the remaining photoresist mask 26a is then typically subjected to a second plasma-exposure step prior to etching of the underlying feature layer 24. Accordingly, argon or hydrogen bromide plasma-generating gas 227 is introduced into the etch chamber 210 through the entry port or ports 226. The source RF generator 218 strikes a typically argon or hydrogen bromide plasma 30, which contacts the photoresist mask 26a and partially etches the striations 27a, further smoothing the sidewalls of the mask openings 27, typically in the same manner and using the same process conditions as those heretofore described with respect to the plasma-exposure step of FIG. 3B.

Figure 3D:
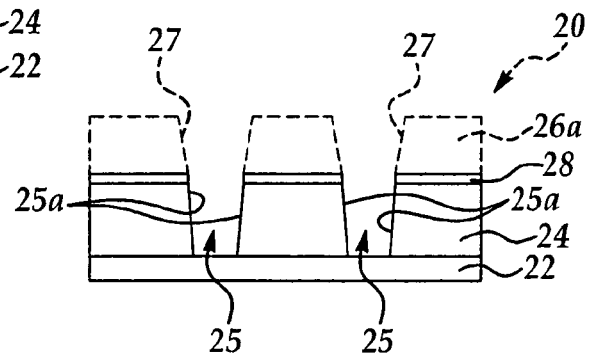

After completion of the plasma-exposure step of FIG. 3C, the plasma 30 is evacuated from the etch chamber 210 as gaseous species 228. Next, as shown in FIG. 3D, the underlying feature layer 24 is etched, according to the pattern of the remaining overlying photoresist mask 26a, to form feature openings 25 that correspond in size and position to the mask openings 27. Accordingly, areas of the feature layer 24 exposed to the etchant through the mask openings 27 are etched, whereas areas of the feature layer 24 which are covered by the photoresist mask 26a are protected from the etchant and remain intact. The etchant gases and process conditions used to etch the feature layer 24 vary according to the material or materials used to form the feature layer 24, and may be carried out using conventional etching techniques known by those skilled in the art.

During etching of the feature layer 24, the photoresist mask 26a is further progressively etched and gradually decreases in thickness. Finally, as further shown in FIG. 3D, the resist mask 26 is stripped from the underlying BARC layer 28. The remaining BARC layer 28 may also be removed from the feature layer 24 prior to further fabrication of the IC device feature or features on the semiconductor portion 20.

It will be appreciated by those skilled in the art that the in-situ plasma treatment method of the present invention substantially reduces or eliminates standing wave-induced striations from the sidewalls of mask openings in a photoresist mask and strengthens the mask. Therefore, resist selectivity is enhanced, resist tilting is reduced or eliminated and CD uniformity is maintained during the subsequent etching process. Accordingly, it will be appreciated from a consideration of FIG. 3D that the sidewalls 25a of the feature openings 25 subsequently etched in the feature layer 24 are substantially smooth and uniform, precisely reflecting the circuit pattern feature or features previously formed in the photoresist mask 26a.

Figure 4:
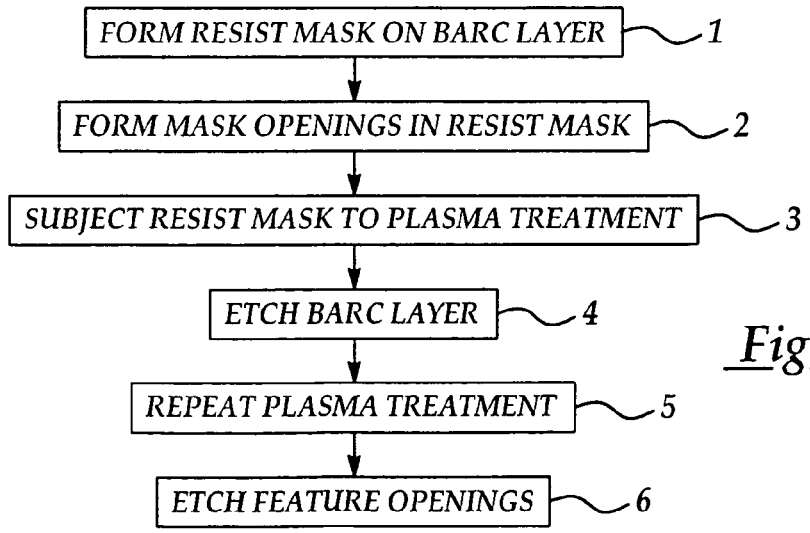
FIG. 4 is a flow diagram which summarizes sequential process steps in implementation of the in-situ plasma treatment method of the present invention.

A typical sequence of process steps according to the method of the present invention is summarized in FIG. 4. In process step 1, a photoresist mask is formed on a BARC (bottom anti-reflective coating) layer provided over a feature layer on a substrate. In process step 2, mask openings are patterned in the photoresist mask typically using conventional photolithography techniques. In process step 3, the photoresist mask is subjected to a photoresist-strengthening plasma. In process step 4, the BARC layer is etched. In process step 5, the photoresist mask is again subjected to a photoresist-strengthening plasma. In process step 6, feature openings are etched in the feature layer according to the photoresist mask.

While the preferred embodiments of the invention have been described above, it will be recognized and understood that various modifications can be made in the invention and the appended claims are intended to cover all such modifications which may fall within the spirit and scope of the invention.

What is claimed is:

1. A method of strengthening and enhancing selectivity of a photoresist mask including removing photoresist mask sidewall striations, comprising:
   providing a substrate having a feature layer on said substrate and a photoresist layer on a bottom anti-reflective coating layer above said feature layer;
   forming a photoresist mask in said photoresist layer by exposing said photoresist layer to a light source and developing said photoresist layer;
   exposing said photoresist mask to a first photoresist-strengthening plasma including partially removing said sidewall striations;
   etching through said bottom anti-reflective coating layer in a separate etching step;
   exposing said photoresist mask to a second photoresist-strengthening plasma following said etching through said bottom anti-reflective coating, said second photoresist-strengthening plasma further smoothing said sidewalls to remove said sidewall striations; and,
   etching said feature layer according to said photoresist mask.

2. The method of claim 1 wherein at least one of said first and second photoresist-strengthening plasmas comprises an argon plasma.

3. The method of claim 1 wherein said light source has a wavelength of less than about 193 nm.

4. The method of claim 1 wherein at least one of said steps of exposing said photoresist mask to a first and a second photoresist-strengthening plasma comprises exposing said photoresist mask to an argon plasma at a pressure of about 5~80 mTorr, a source power of about 300~1200 W, an argon flow rate of about 50~480 sccm and a plasma exposure time of about 15~60 sec.

5. The method of claim 1 wherein either or both of said steps of exposing said photoresist mask to a photoresist-strengthening plasma comprises applying a bias power of less than about 50 watts to said substrate.

6. The method of claim 1 wherein at least one of said photoresist-strengthening plasmas is a plasma other than an argon plasma and hydrogen bromide plasma.

7. A method of strengthening and enhancing selectivity of a photoresist mask including removing photoresist mask sidewall striations, comprising:
  providing a substrate having a feature layer on said substrate, a bottom anti-reflective coating layer on said feature layer and a photoresist layer on said bottom anti-reflective coating layer;
  forming a photoresist mask in said photoresist layer by exposing said photoresist layer to ultraviolet radiation and developing said photoresist layer to form said photoresist mask sidewall striations;
  exposing said photoresist mask to a first photoresist-strengthening plasma said first photoresist-strengthening plasma including removing at least a portion of said photoresist mask sidewall striations;
  etching through said bottom anti-reflective coating layer to said feature layer in a separate etching step;
  exposing said photoresist mask to a second photoresist-strengthening plasma following said step of etching through said bottom anti-reflective coating, said second photoresist-strengthening plasma removing a remaining portion of said photoresist mask sidewall striations; and
  etching said feature layer according to said photoresist mask.

8. The method of claim 7 wherein at least one of said steps of exposing said photoresist mask to a first and a second photoresist-strengthening plasma comprises exposing said photoresist mask to an argon plasma at a pressure of about 5~80 mTorr, a source power of about 300~1200 W, an argon flow rate of about 50~480 sccm and a plasma exposure time of about 15~60 sec.

9. The method of claim 7 wherein said ultraviolet radiation has a wavelength of less than about 193 nm.

10. A method of strengthening and enhancing selectivity of a photoresist mask including removing photoresist mask sidewall striations, comprising:
  providing a substrate having a feature layer on said substrate, a bottom anti-reflective coating layer on said feature layer and a photoresist layer on said bottom anti-reflective coating layer;
  forming a photoresist mask in said photoresist layer by exposing said photoresist layer to ultraviolet radiation and developing said photoresist layer to form said photoresist mask sidewall striations;
  exposing said photoresist mask to a photoresist-strengthening plasma in a first plasma-exposure step including partially removing said sidewall striations, said photoresist-strengthening plasma comprising an argon plasma;
  etching through said bottom anti-reflective coating layer in a separate etching step;
  exposing said photoresist mask to said photoresist-strengthening plasma in a second plasma-exposure step following said etching through said bottom anti-reflective coating, said second plasma-exposure step further smoothing said sidewalls to remove said sidewall striations; and
  etching said feature layer according to said photoresist mask.

11. The method of claim 10 wherein said ultraviolet radiation has a wavelength of less than about 193 nm.

12. The method of claim 10 wherein said exposing said photoresist mask to said photoresist-strengthening plasma comprises said argon plasma at a pressure of about 5~80 mTorr, a source power of about 300~1,200 W, an argon flow rate of about 50~480 sccm and a plasma exposure time of about 15~60 sec.

13. The method of claim 7, wherein the first and second plasma strengthening plasmas are selected from the group consisting of an argon plasma and a hydrogen bromide plasma.

14. The method of claim 7, wherein the first and second plasma strengthening plasmas comprise an argon plasma.

15. The method of claim 7, wherein the first and second plasma strengthening plasmas comprise a hydrogen bromide plasma.

16. The method of claim 1 wherein the first and second photoresist-strengthening plasmas comprise an argon plasma.

17. The method of claim 1 wherein at least one of said first and second photoresist-strengthening plasmas comprises a hydrogen bromide plasma.

18. The method of claim 1 wherein said first and second photoresist-strengthening plasmas comprise a hydrogen bromide plasma.

19. The method of claim 1, wherein the first plasma strengthening plasma comprises a hydrogen bromide plasma and the second plasma strengthening plasma comprises an argon plasma.

20. The method of claim 1, wherein the first plasma strengthening plasma comprises an argon plasma and the second plasma strengthening plasma comprises a hydrogen bromide plasma.

* * * * *